United States Patent
Tu et al.

(10) Patent No.: US 8,846,548 B2
(45) Date of Patent: Sep. 30, 2014

(54) POST-PASSIVATION INTERCONNECT STRUCTURE AND METHODS FOR FORMING THE SAME

(71) Applicant: Taiwan Semiconductor Manufacturing Company, Ltd., Hsin-Chu (TW)

(72) Inventors: Chia-Wei Tu, Chunan Town (TW); Yian-Liang Kuo, Toufen Township (TW); Wei-Lun Hsieh, Tainan (TW); Tsung-Fu Tsai, Changhua (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 11 days.

(21) Appl. No.: 13/737,177

(22) Filed: Jan. 9, 2013

(65) Prior Publication Data
US 2014/0191392 A1    Jul. 10, 2014

(51) Int. Cl.
*H01L 21/469* (2006.01)
*H01L 21/44* (2006.01)
*H01L 23/52* (2006.01)
*H01L 23/498* (2006.01)
*H01L 21/768* (2006.01)

(52) U.S. Cl.
CPC .... *H01L 21/76885* (2013.01); *H01L 23/49811* (2013.01)
USPC ........... 438/780; 438/612; 438/613; 438/614; 438/778; 257/737; 257/780; 257/784; 257/E23.021

(58) Field of Classification Search
USPC .......... 257/737, 738, E23.021, E23.069, 780, 257/784; 438/612–617, 778, 780
See application file for complete search history.

(56) References Cited

U.S. PATENT DOCUMENTS

| | | | |
|---|---|---|---|
| 6,077,726 A * | 6/2000 | Mistry et al. | 438/108 |
| 2002/0020855 A1 | 2/2002 | Hwang | |
| 2004/0004283 A1 | 1/2004 | Yew et al. | |
| 2004/0253388 A1 | 12/2004 | Kim | |
| 2009/0283903 A1* | 11/2009 | Park | 257/737 |
| 2011/0101527 A1* | 5/2011 | Cheng et al. | 257/738 |
| 2011/0309490 A1* | 12/2011 | Lu et al. | 257/737 |

FOREIGN PATENT DOCUMENTS

| | | |
|---|---|---|
| KR | 1020000023511 | 4/2000 |
| KR | 1020010029097 | 4/2001 |
| KR | 1020040108010 | 12/2004 |

* cited by examiner

*Primary Examiner* — Jasmine Clark
(74) *Attorney, Agent, or Firm* — Slater & Matsil, L.L.P.

(57) ABSTRACT

A method includes forming a polymer layer over a passivation layer, wherein the passivation layer further comprises a portion over a metal pad. The polymer layer is patterned to form an opening in the polymer layer, wherein exposed surfaces of the polymer layer have a first roughness. A surface treatment is performed to increase a roughness of the polymer layer to a second roughness greater than the first roughness. A metallic feature is formed over the exposed surface of the polymer layer.

22 Claims, 10 Drawing Sheets

POST-PASSIVATION INTERCONNECT STRUCTURE AND METHODS FOR FORMING THE SAME

BACKGROUND

In the formation of integrated circuits, integrated circuit devices such as transistors are first formed at the surface of a semiconductor substrate in a wafer. An interconnect structure is then formed over the integrated circuit devices. A metal pad is formed over, and is electrically coupled to, the interconnect structure. A passivation layer and a first polymer layer are formed on the metal pad, with the metal pad exposed through the openings in the passivation layer and the first polymer layer.

A Post-passivation interconnect (PPI) structure is then formed, which includes a redistribution line connected to the metal pad. A second polymer layer is then formed over the PPI. An Under-Bump-Metallurgy (UBM) is formed extending into an opening in the second polymer layer, wherein the UBM is electrically connected to the PPI. A solder ball is then placed over the UBM and reflowed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Post-Passivation Interconnect (PPI) structure and the method of forming the same are provided in accordance with an embodiment. The intermediate stages of manufacturing various embodiments are illustrated. The variations of the embodiment are then discussed. Throughout the various views and illustrative embodiments, like reference numbers are used to designate like elements.

Figure 1:
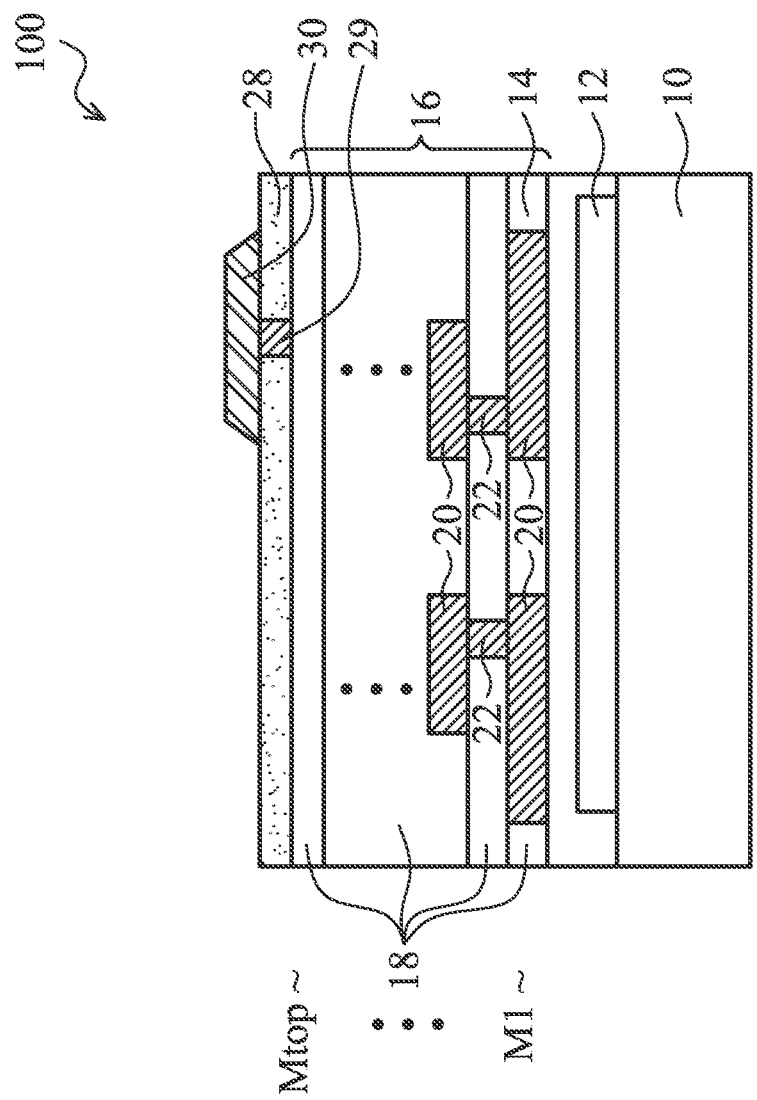
FIGS. 1 through 10 are cross-sectional views of intermediate stages in the manufacturing of a wafer comprising a Post-Passivation Interconnect (PPI) structure in accordance with some exemplary embodiments.

Referring to FIG. 1, wafer 100, which includes semiconductor substrate 10, is provided. Semiconductor substrate 10 may be a bulk silicon substrate or a silicon-on-insulator substrate. Alternatively, other semiconductor materials that include group III, group IV, and group V elements may also be used, which may include silicon germanium, silicon carbon, and/or III-V compound semiconductor materials. Integrated circuit devices such as transistors (schematically illustrated as 12) are formed in and/or on semiconductor substrate 10. Wafer 100 may further include Inter-Layer Dielectric (ILD) 14 over semiconductor substrate 10, and interconnect structure 16 over ILD 14. Interconnect structure 16 includes metal lines 20 and vias 22, which are formed in dielectric layers 18. The combination of metal lines at a same level is referred to a metal layer hereinafter. Accordingly, interconnect structure 16 may include a plurality of metal layers that are interconnected through vias 22. Metal lines 20 and vias 22 may be formed of copper or copper alloys, although they can also be formed of other metals. In some embodiments, dielectric layers 18 are formed of low-k dielectric materials. The dielectric constants (k values) of the low-k dielectric materials may be less than about 3.0, or less than about 2.5, for example.

The metal layers include bottom metal layer (also referred to as metal layer one, or M1) through a top metal layer (Mtop). In some embodiments, the Mtop layer is the topmost metal layer that is formed in low-k dielectric materials.

In some embodiments, passivation layer 28 is formed over top metal layer Mtop and the respective dielectric layer 18. Passivation layer 28 has a k value greater than 3.8, and is formed using a non-low-k dielectric material. In some embodiments, passivation layer 28 is a composite layer comprising a silicon oxide layer (not shown), and a silicon nitride layer (not shown) over the silicon oxide layer. Passivation layer 28 may also be formed of other non-porous dielectric materials such as Un-doped Silicate Glass (USG), silicon oxynitride, and/or the like. Via 29 is formed in passivation layer 28 and may be electrically coupled to integrated circuit devices 12. In alternative embodiments, a metal line or a metal pad is formed in passivation layer 28 and connected to the metal lines in the Mtop layer.

Metal pad 30 is formed over passivation layer 28, and may be electrically coupled to integrated circuit devices 12 through via 29, metal lines 20, and vias 22. Metal pad 30 may be an aluminum pad or an aluminum-copper pad, and hence is alternatively referred to as aluminum pad 30 hereinafter, although other metallic materials may be used.

Figure 2:
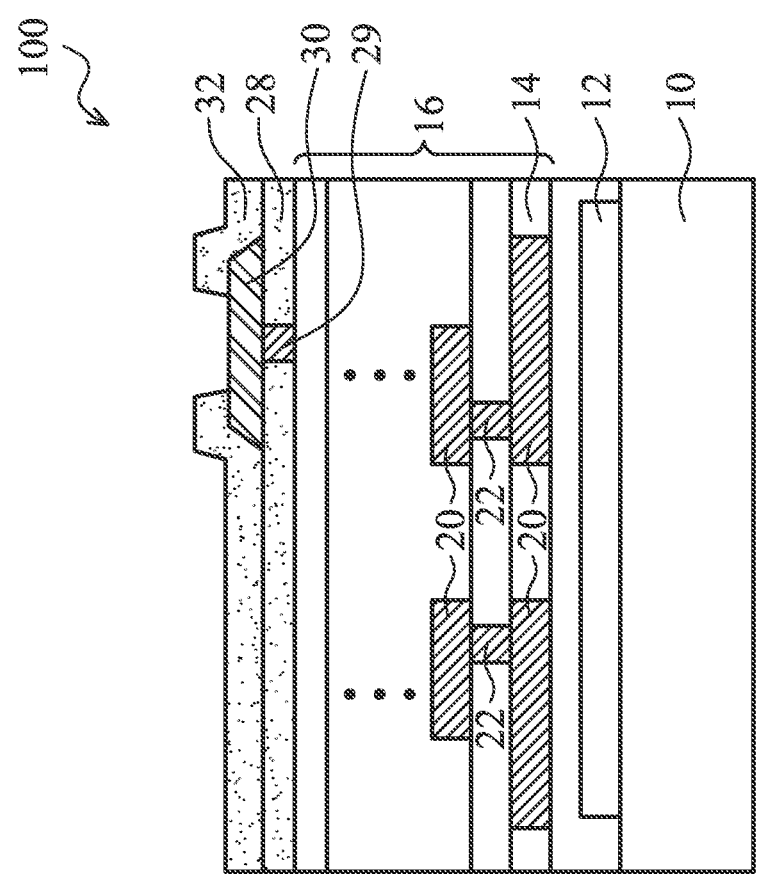

Referring to FIG. 2, passivation layer 32 is formed over passivation layer 28. The material of passivation layer 32 may be selected from the same candidate materials of passivation layer 28. Passivation layers 28 and 32 may be formed of a same dielectric material, or may be formed of different dielectric materials. In some embodiments, passivation layer 32 includes a silicon oxide layer, and a silicon nitride layer over the silicon oxide layer. Passivation layer 32 is patterned, so that a portion of passivation layer 32 may cover the edge portions of aluminum pad 30, and a central portion of aluminum pad 30 is exposed through an opening in passivation layer 32. Passivation layer 32 may also include a portion level with metal pad 30.

Figure 3:
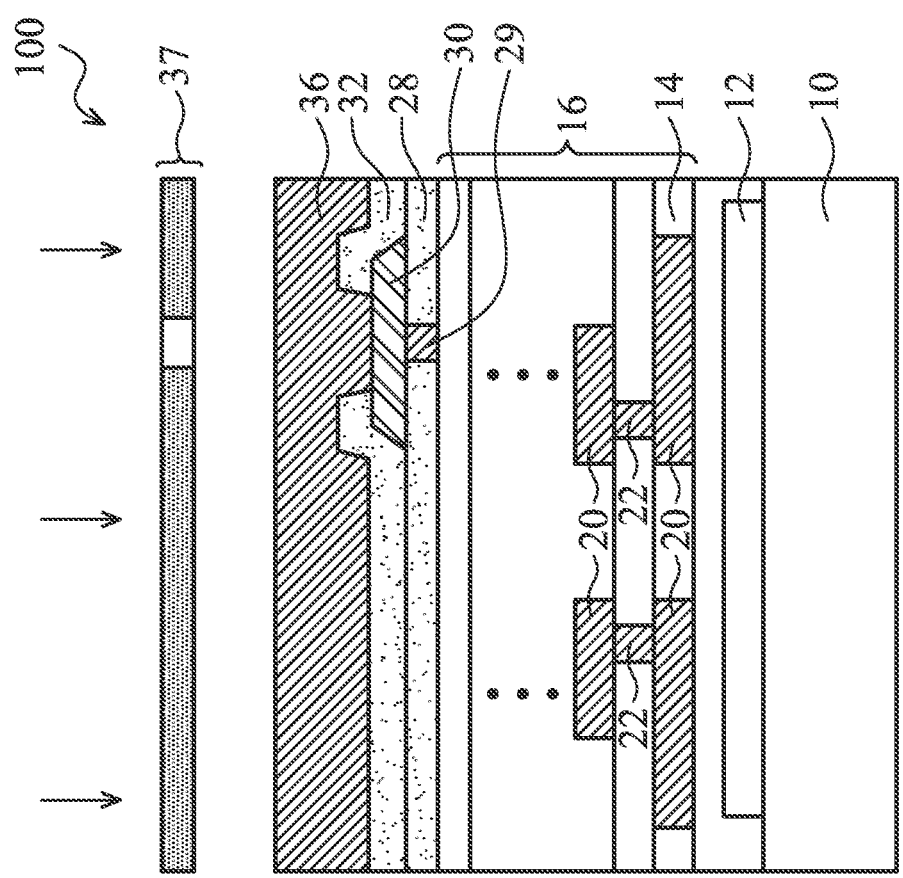

FIG. 3 illustrates the formation of polymer layer 36. The formation process may include spin coating to cover an entirety of the structure in FIG. 2, followed by a first curing process. In some exemplary embodiments, the first curing process is performed at a temperature between about 180° C. and about 360° C., with a duration between about 30 minutes and about 180 minutes. As a result of the first curing process, polymer layer 36 is solidified. Polymer layer 36 may be formed of a polymer selected from polyimide, benzocyclobutene (BCB), polybenzoxazole (PBO), and the like. The material of polymer layer 36 may be photo sensitive, although non-photo-sensitive materials may be used. For example, polyimide may be the photo sensitive material used in polymer layer 36.

Figure 4:
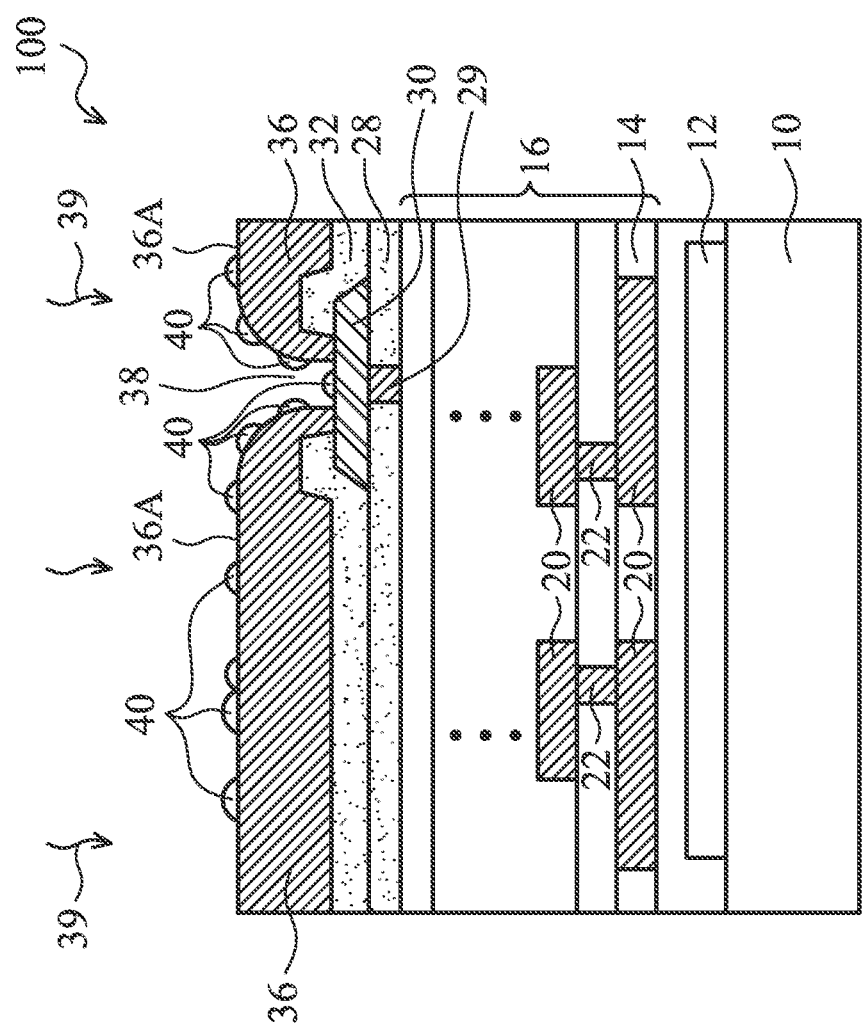

Referring to FIGS. 3 and 4, polymer layer 36 is patterned. In the embodiments wherein polymer layer 36 is photo sensitive, as shown in FIG. 3, lithography mask 37, which includes transparent portions to allow light to pass through and opaque portions to block light, is used to expose polymer layer 36. The exposed polymer layer 36 is developed, and undesirable portions are removed. The resulting structure is shown in FIG. 4. In alternative embodiments in which polymer layer 36 is formed of a non-photo-sensitive material, a photo resist (not shown) may be formed over polymer layer 36 and then patterned using lithography mask 37, for example. Polymer layer 36 is then etched, followed by the removal of the photo resist. The resulting structure is also shown in FIG. 4. After the patterning, opening 38 is formed in polymer layer 36, through which aluminum pad 30 is exposed.

After the patterning of polymer layer 36, a second curing process may be performed, for example, through a thermal curing. In an exemplary curing process, during the curing, the temperature of wafer 100 is between about 180° C. and about 360° C., and the curing duration is between about 80 minutes and about 120 minutes. The curing may also be performed in a process containing an oven, a hot plate, and combinations thereof. The second curing step results in a full solidification of polymer layer 36 and the stability of its chemical property.

As a result of the preceding steps, residue 40, which is schematically illustrated in FIG. 4, may be left on the exposed surfaces, which includes surfaces 36A of polymer layer 36 and the top surface of metal pad 30. Residue 40 may include the oxides of the organic materials that are used in preceding steps, which steps include the patterning of polymer layer 36. An ashing step is then performed to remove residue 40, wherein the ashing step is represented by arrows 39. In some embodiments, the ashing is performed in an oxygen-containing environment (a chamber, for example), in which an oxygen-containing gas is used as a process gas. The oxygen-containing process gas may include oxygen ($O_2$), ozone ($O_3$), or combinations thereof. An electrical field may be, or may not be, applied during the ashing, so that the plasma may be directional or non-directional. The ashing is performed by generating a plasma from the process gas. The duration of the ashing may be long enough, so that substantially an entirety of residue 40 is removed. In some exemplary embodiments, the ashing is performed for a duration longer than about 25 seconds, longer than about 30 seconds, or longer than about 40 seconds.

Figure 5:
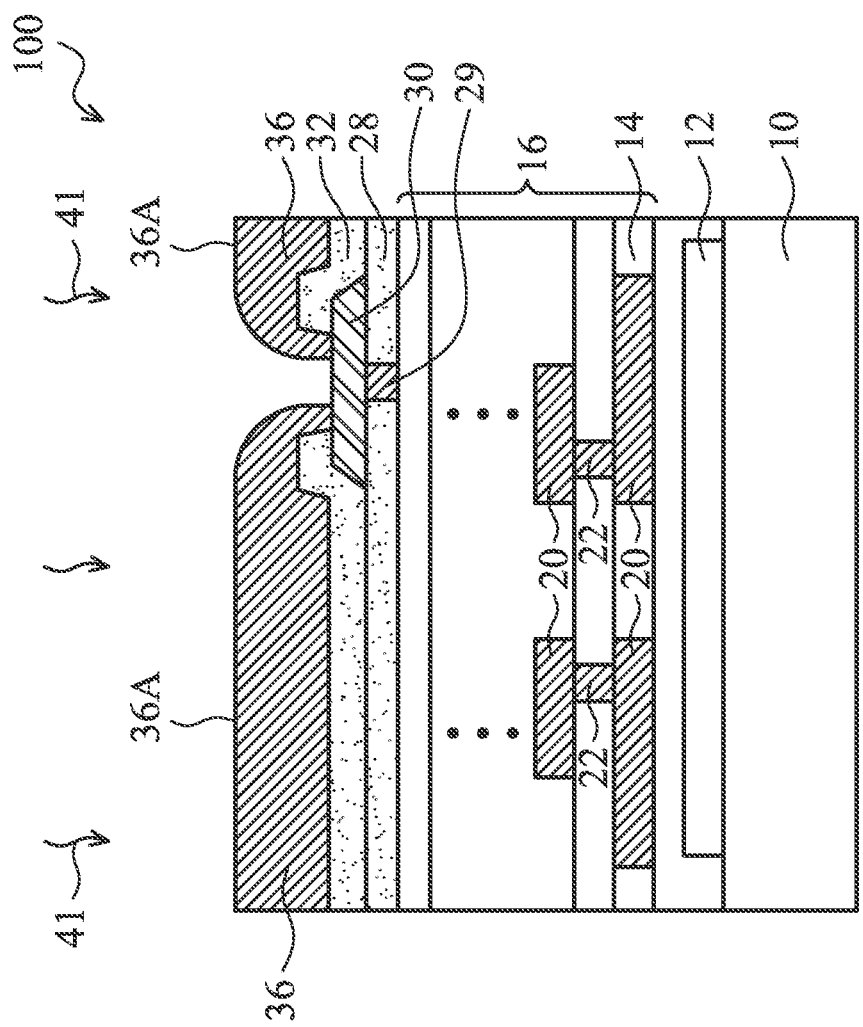

In some embodiments, after the second curing, and before or after the ashing process, top surfaces 36A of polymer layer 36 has a first roughness smaller than about 10 nm. Referring to FIG. 5, a treatment is performed on the exposes surfaces 36A to increase the roughness of surfaces 36A. The treatment is also represented by arrows 41. In some embodiments, the surface treatment is performed in a process chamber to sputter surface 36A of polymer layer 36. The exemplary process gas includes nitrogen ($N_2$), argon, gallium, xeon, and/or the like, from which process gas a plasma is generated for the surface treatment. An electrical field may be applied, so that the plasma is directional, and hence may have the effect of sputtering the materials of polymer layer 36 away from the surface of polymer layer 36, causing the roughness of polymer layer 36 to increase. Accordingly, the surface treatment comprises a plasma treatment with the effect of sputtering on polymer layer 36. During the treatment, the temperature of wafer 100 may be at room temperature (about 21° C.), for example, although the temperature may be lowered or increased. After the surface treatment, the roughness of surfaces 36A increases to a second roughness. A ratio of the second roughness to the first roughness may be greater than about 2, greater than about 4, greater than 6, or greater than 10, depending on the conditions of the surface treatment. In some exemplary embodiments, the second roughness is greater than about 20 nm, and may be greater than about 35 nm.

Figure 6:
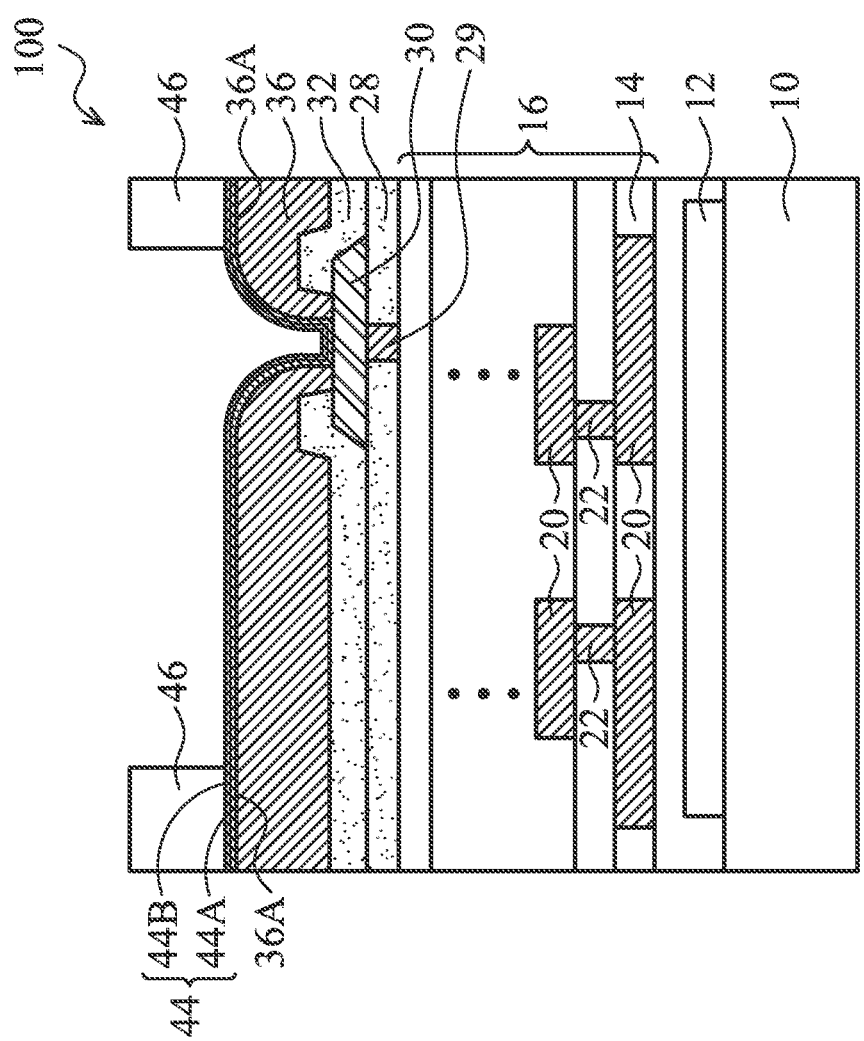
Figure 7:
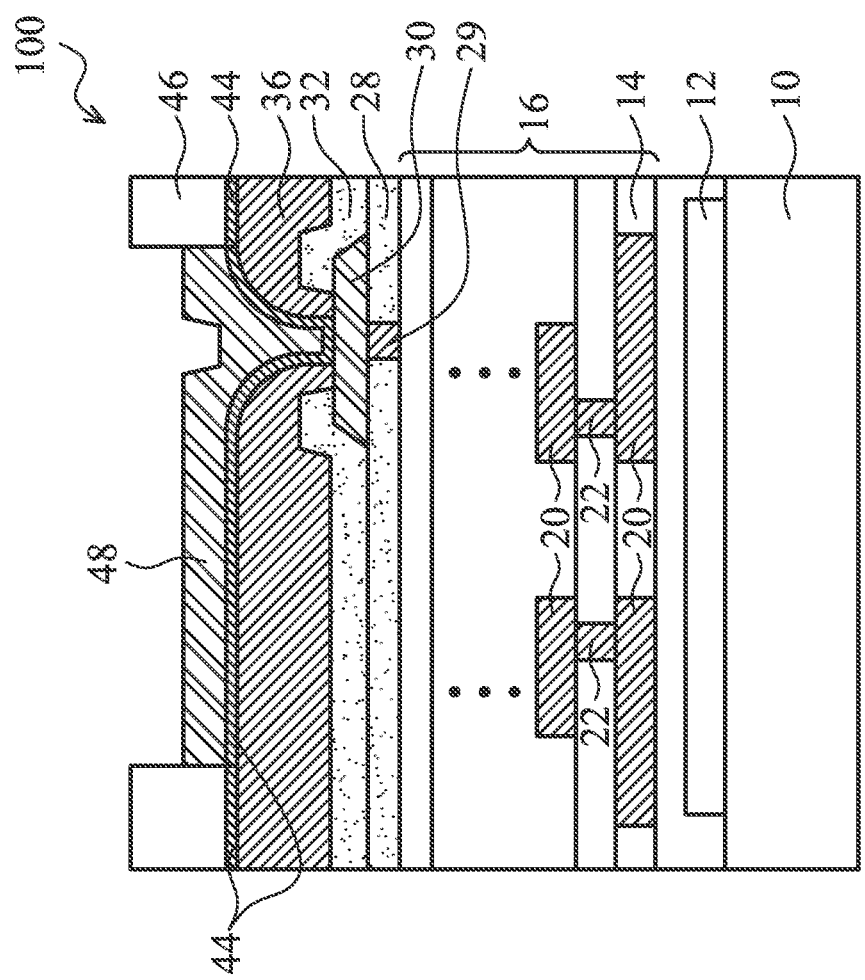
Figure 8:
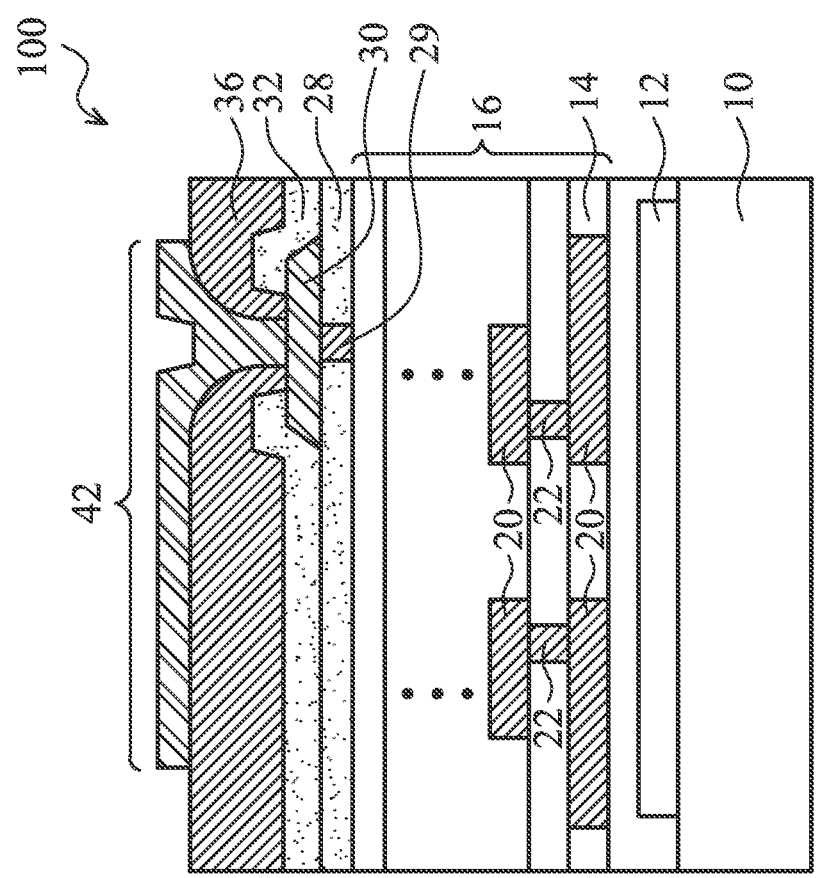

FIGS. 6, 7, and 8 illustrate the formation of Post-Passivation Interconnect (PPI) 42 (FIG. 8), which is a redistribution line. PPI 42 is electrically connected to aluminum pad 30 through opening 38 (FIG. 4) in polymer layer 36. PPI 42 is such named since the formation of PPI 42 is after the formation of passivation layer 32. Referring to FIG. 6, seed layer 44 is blanket formed on surfaces 36A of polymer layer 36 and the top surface of metal pad 30. The formation method may include Physical Vapor Deposition (PVD), for example. Seed layer 44 may include titanium layer 44A, and copper seed layer 44B over titanium layer 44A. Mask layer 46 is then formed over seed layer 44, and is then patterned. Mask layer 46 may comprise a photo resist or a dry film.

Next, referring to FIG. 7, metallic material 48, which may comprise pure copper, substantially pure copper, or a copper alloy, is formed in the opening in mask layer 46. The formation may include plating. After the formation of metallic material 48, mask layer 46 is removed, and the portions of seed layer 44 underlying mask layer 46 are removed. The resulting structure is shown in FIG. 8. The remaining portions of metallic material 48 and seed layer 44 are in combination referred to as PPI 42 hereinafter, which includes a portion extending into the opening in polymer layer 36, and a portion over polymer layer 36.

Figure 9:
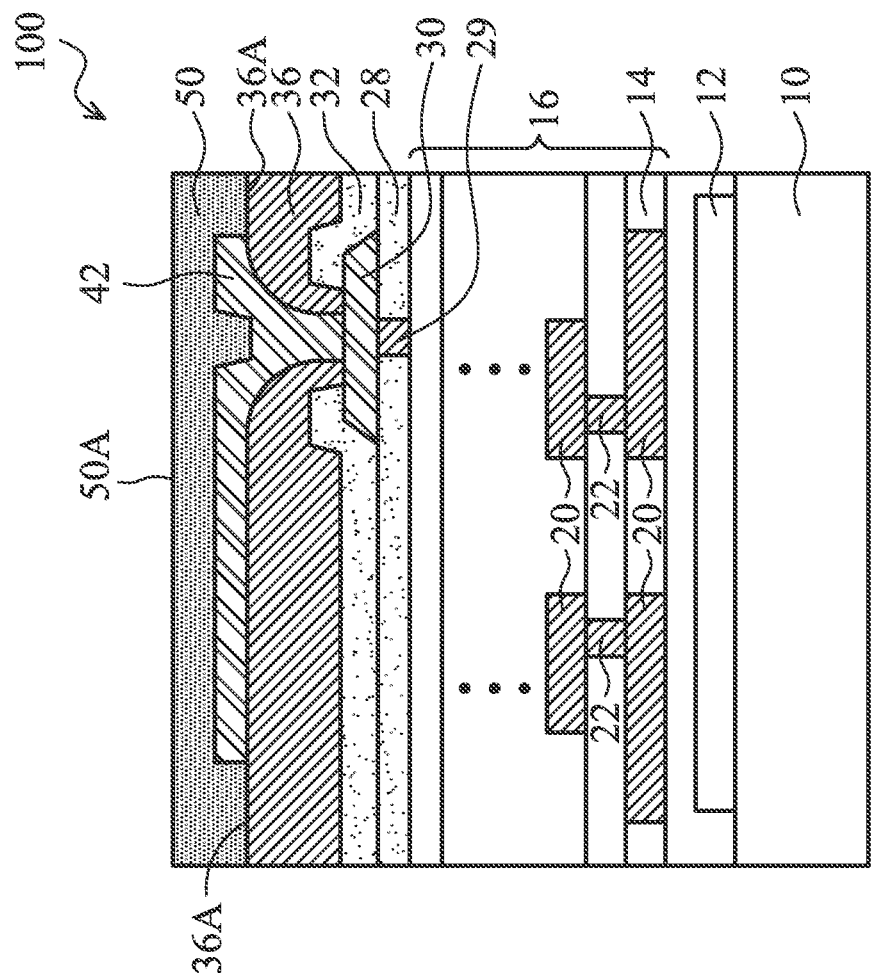
Figure 10:
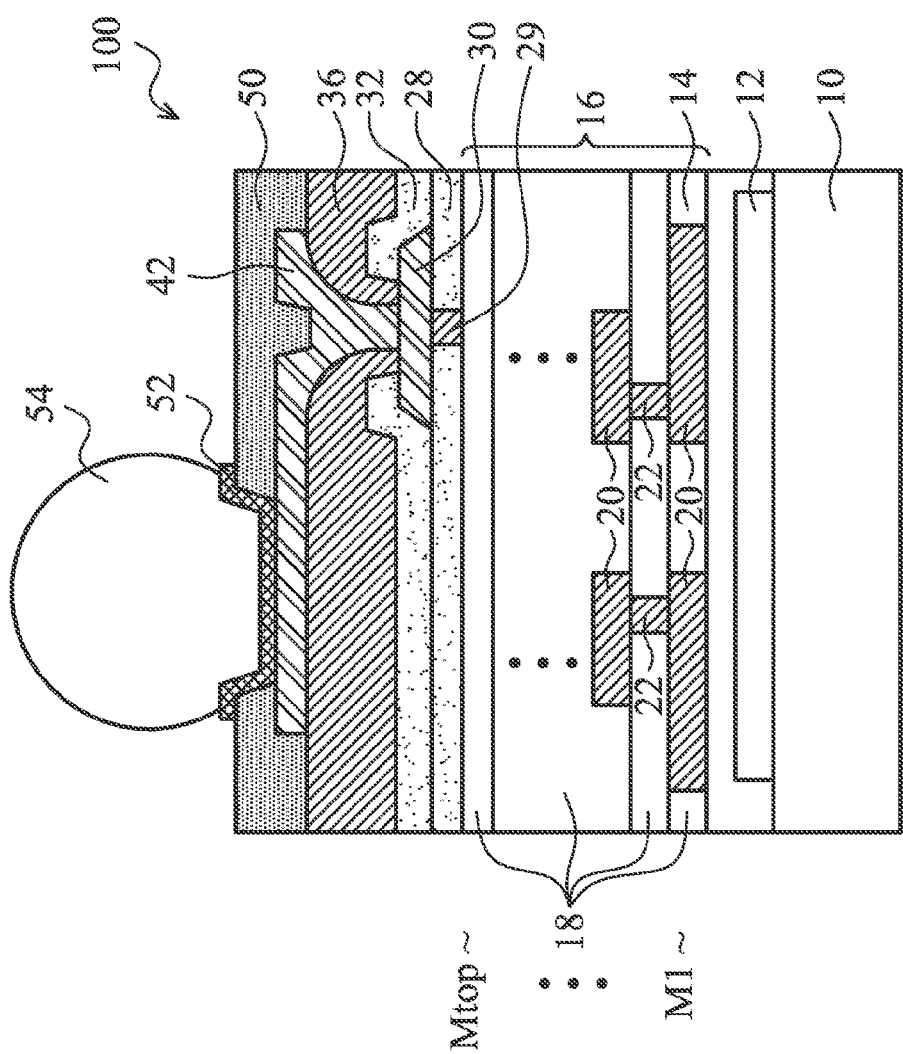

FIGS. 9 and 10 illustrate the formation and patterning of polymer layer 50 and Under-Bump-Metallurgy (UBM) layer 52. Referring to FIG. 9, in some embodiments, an entirety of PPI 42 is covered by polymer layer 50. Polymer layer 50 may be formed of a material selected from the same group of candidate materials for forming polymer layer 36. For example, polymer layer 50 may comprise polyimide or another polymer-based material such as PBO, BCB, an epoxy, or the like. Polymer layers 36 and 50 may be formed of a same material, such as polyimide, or different materials. In some embodiments, polymer layer 50 is formed using spin coating, and is then cured. In some embodiments, no surface treatment is performed on the surface of polymer layer 50 after its formation. Top surfaces 50A of polymer layer 50 have a third roughness, which may be smaller than about 10 nm. A ratio of the second roughness of the treated surface 36A to the third roughness may be greater than about 2, greater than about 4, greater than about 6, or greater than about 10. In some exemplary embodiments, the second roughness is greater than about 20 nm or greater than about 35 nm.

Next, as shown in FIG. 10, UBM 52 is formed. In some embodiments, UBM 52 includes a barrier layer and seed layer (not shown) over the barrier layer. UBM 52 extends into the opening in polymer layer 50, and is electrically coupled to, and may be in physical contact with, PPI 42. The barrier layer may be a titanium layer, a titanium nitride layer, a tantalum layer, a tantalum nitride layer, or layers formed of a titanium alloy or a tantalum alloy. The materials of the seed layer may include copper or copper alloys. In some embodiments, UBM 52 is formed using PVD or other applicable methods.

Further referring to FIG. 10, connector 54 is formed. In some embodiments, connector 54 is a metal region, which is either a metal ball, such as a solder ball or a copper ball placed on UBM layer 52, or a metal pillar formed on UBM 52 through plating. In the embodiments connector 54 comprises solder, the solder may be plated, and the plating of solder and the formation of UBM 52 may be similar to the formation of PPI 42. The metal region, when comprising solder, may then go through a reflow process, and a solder ball is formed as connector 54. In alternative embodiments, connector 54 comprises a non-reflowable metal pillar, which may be a copper pillar. Additional layers such as a nickel layer, a solder cap, a palladium layer, and the like, may also be formed on the metal pillar.

In the embodiments, by performing the surface treatment, the roughness of the top surface of polymer layer 36 is increased. This results in an improvement in the adhesion between polymer layer 36 and PPI 42. Experiments indicated that some sample wafers made without the surface treatment experienced delamination at the interfaces between polymer layer 36 and PPI 42. The delamination may occur after the reflow of connector 54, which is performed at a high temperature that causes the expansion and the shrinking of polymer layer 36 and PPI 42. Similar sample wafers made using the methods of the embodiments, which include the surface treatment performed on polymer layer 36, however, do not have the delamination observed.

In accordance with embodiments, a method includes forming a polymer layer over a passivation layer, wherein the passivation layer further comprises a portion over a metal pad. The polymer layer is patterned to form an opening in the polymer layer, wherein exposed surfaces of the polymer layer have a first roughness. A surface treatment is performed to increase a roughness of the polymer layer to a second roughness greater than the first roughness. A metallic feature is formed over the exposed surface of the polymer layer.

In accordance with other embodiments, a method includes forming a passivation layer over a metal pad, patterning the passivation layer to expose a portion of the metal pad, forming a polymer layer over the passivation layer and the metal pad, and patterning the polymer layer to form an opening in the polymer layer. A portion of the metal pad is revealed through the opening. A surface treatment is performed on exposed surfaces of the polymer layer, wherein the surface treatment includes sputtering. A PPI is formed over the exposed surfaces of the polymer layer.

In accordance with yet other embodiments, a device includes a passivation layer over a metal pad, a polymer layer over the passivation layer, and a PPI over and contacting top surfaces of the polymer layer. The PPI includes a first portion over the polymer layer, and a second portion in the polymer layer. A surface of the polymer layer contacting the PPI has a roughness greater than about 20 nm.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a polymer layer over a passivation layer, wherein the passivation layer further comprises a portion over a metal pad;
    patterning the polymer layer to form an opening in the polymer layer, wherein exposed surfaces of the polymer layer have a first roughness;
    performing a surface treatment to increase a roughness of a surface of the polymer layer to a second roughness greater than the first roughness; and
    forming a metallic feature over and contacting the surface of the polymer layer with the second roughness.

2. The method of claim 1, wherein the surface treatment comprises sputtering the exposed surfaces of the polymer layer.

3. The method of claim 1, wherein the surface treatment is performed using a plasma of nitrogen.

4. The method of claim 1 further comprising, after patterning the polymer layer and before the surface treatment, performing an ashing step on the exposed surfaces of the polymer layer.

5. The method of claim 4, wherein the ashing step is performed using a plasma of an oxygen-containing gas.

6. The method of claim 1, wherein the surface treatment is configured to make the second roughness to be greater than four times the first roughness.

7. The method of claim 1, wherein the forming the metallic feature comprises:
    blanket forming a seed layer over and contacting the exposed surfaces of the polymer layer and an exposed surface of the metal pad;
    forming and patterning a mask layer over the seed layer;
    depositing a metallic material over the seed layer and in an opening in the mask layer; and
    removing the mask layer and portions of the seed layer covered by the mask layer, wherein a remaining portion of the metallic material and an underlying portion of the seed layer form the metallic feature.

8. A method comprising:
    forming a passivation layer over a metal pad;
    patterning the passivation layer to expose a portion of the metal pad;
    forming a first polymer layer over the passivation layer and the metal pad;
    patterning the first polymer layer to form an opening in the first polymer layer, wherein a portion of the metal pad is revealed through the opening;
    performing a surface treatment on exposed surfaces of the first polymer layer, wherein the surface treatment comprises sputtering the exposed surfaces of the first polymer layer; and
    forming a Post-Passivation Interconnect (PPI) over the exposed surfaces of the first polymer layer.

9. The method of claim 8 further comprising, before the surface treatment and after the patterning the first polymer layer, performing an ashing step on the exposed surfaces of the first polymer layer.

10. The method of claim 9, wherein the ashing is performed for a duration greater than about 25 seconds.

11. The method of claim 8 further comprising:
    forming a second polymer layer over the PPI and the passivation layer;
    forming a Under-Bump Metallurgy (UBM) extending into the second polymer layer; and
    forming a connector over the UBM and electrically coupled to the metal pad.

12. The method of claim 8, wherein the sputtering is performed using a plasma of nitrogen ($N_2$).

13. The method of claim 8, wherein a surface roughness of the exposed surfaces of the first polymer layer is increased by the surface treatment.

14. The method of claim 8, wherein the sputtering is performed until a roughness of the exposed surfaces of the first polymer layer is increased to greater than about four times an additional roughness of the first polymer layer, and wherein the additional roughness is a roughness of the first polymer layer before the sputtering is performed.

15. The method of claim 8, wherein in the sputtering, surface portions of the first polymer layer are removed by the sputtering.

16. A device comprising:
- a passivation layer over a metal pad;
- a first polymer layer over the passivation layer; and
- a Post-Passivation Interconnect (PPI) over and contacting top surfaces of the first polymer layer, wherein the PPI comprises a first portion over the first polymer layer, and a second portion in the first polymer layer, and wherein a surface of the first polymer layer contacting the PPI has a roughness greater than about 20 nm.

17. The device of claim 16, wherein the first polymer layer comprises polyimide.

18. The device of claim 16 further comprising:
- a second polymer layer over the PPI and the passivation layer, wherein a roughness of the second polymer layer is smaller than about 10 nm;
- an Under-Bump Metallurgy (UBM) extending into the second polymer layer; and
- a connector over the UBM and electrically coupled to the metal pad.

19. The device of claim 18, wherein the first polymer layer and the second polymer layer are formed of a same material.

20. The device of claim 16, wherein the passivation layer has a k value greater than about 3.9, and wherein the device further comprises a plurality of low-k dielectric layers underlying the passivation layer and the metal pad.

21. The device of claim 16, wherein the surface of the first polymer layer contacting the PPI comprises a first portion contacting the first portion of the PPI, and a second portion contacting the second portion of the PPI.

22. The device of claim 16, wherein the surfaces of the first polymer layer comprise a sidewall surface contacting a via portion of the PPI, and wherein the sidewall surface has the roughness greater than about 20 nm.

* * * * *